United States Patent
Lee

(10) Patent No.: US 7,632,131 B2
(45) Date of Patent: Dec. 15, 2009

(54) STRUCTURE OF ELECTRONIC CONNECTOR

(75) Inventor: Ching-Yao Lee, Taipei (TW)

(73) Assignee: T-Conn Precision Corporation (TW)

( * ) Notice: Subject to any disclaimer, the term of this patent is extended or adjusted under 35 U.S.C. 154(b) by 296 days.

(21) Appl. No.: 11/872,716

(22) Filed: Oct. 16, 2007

(65) Prior Publication Data

US 2009/0097217 A1 Apr. 16, 2009

(51) Int. Cl.
*H01R 13/627* (2006.01)
(52) U.S. Cl. ............... 439/353; 439/352; 439/345
(58) Field of Classification Search ........... 439/701, 439/680, 378, 352–357
See application file for complete search history.

(56) References Cited

U.S. PATENT DOCUMENTS

| | | | | |
|---|---|---|---|---|
| 6,383,011 | B2 * | 5/2002 | Chen | 439/357 |
| 6,666,706 | B1 * | 12/2003 | Jones et al. | 439/353 |
| 7,234,957 | B2 * | 6/2007 | Wang | 439/353 |

\* cited by examiner

*Primary Examiner*—Briggitte R Hammond
(74) *Attorney, Agent, or Firm*—Ching-Yao Lee; T-Conn Precision Corp.

(57) ABSTRACT

A structure of an electronic connector that can be plugged by inserting from top-to-down direction is disclosed. The electronic connector has a connector case and a Seat connector. The connector case has a plurality of terminal holes for receiving terminals, and a recession is formed at the center of the connector case. A buckle is formed underneath the recession, and has a protrusion hook. The seat connector case has a plurality of terminal holes for receiving terminals, and buckling troughs corresponding to the buckles on the connector case, and the buckling troughs have a buckling plate extending there-from.

6 Claims, 4 Drawing Sheets

STRUCTURE OF ELECTRONIC CONNECTOR

FIELD OF THE INVENTION

The present invention relates to a structure of an electronic connector. More particularly, the present invention relates to an electronic connector structure that allow vertical and horizontal plugging fixation of electronic device.

BACKGROUND OF THE INVENTION

Many currently available electronic devices are of small size, for example, small installation space for hard disc drive of notebook computers, no spared moving space in the front nor back side. Hence hard disc drive can be inserted into hard disc slot only from a top-to-down direction.

However, for connectors of general hard disc drives, horizontal insertion are not applicable, thus the industry of the field has designed several sets of connectors with longitudinal insertion to meet the demand. However, since in an insulation case, several parts (more than two) for assembly are required besides, as discovered from implementation, the insertion positioning of connector and seat connector as well as the stability of contact conduction with terminals still leave a great room for improvement.

In view of the above described shortcomings, the inventors sought to ameliorate the structures thereof and reduce costs. After conducting numerous experiments and researches, the inventors obtained a structure which is easy for implementation, meanwhile achieves the feature and purpose for robust insertion between connector and seat connector as well as stability of contact conduction with terminal.

From the following detailed description, with reference to the appended drawings, the structure, purpose, approach and spirit of the present invention can be fully appreciated.

SUMMARY OF THE INVENTION

An improvement of electronic connector is hereby illustrated, which presents a structural design of a vertical from top-to-down insertion fixation of a connector and a seat connector. The connector comprises a case comprising a plurality of terminal holes for receiving terminals. The case is disposed on the seat connector. The case comprises a recession at the center thereof. The connector comprises a buckle comprising a hump hook and the seat connector comprises a buckle trough corresponding to the buckle on the connector case, wherein the buckle trough extends with a buckling plate.

The buckling plate of the seat connector comprises a buckling hole for the insertion fixation of the buckler of the connector case. In the meantime, the protrusion plates on both two sides of the connector case and two sides of the seat connector case form the top leaning.

DETAILED DESCRIPTION

Figure 1:
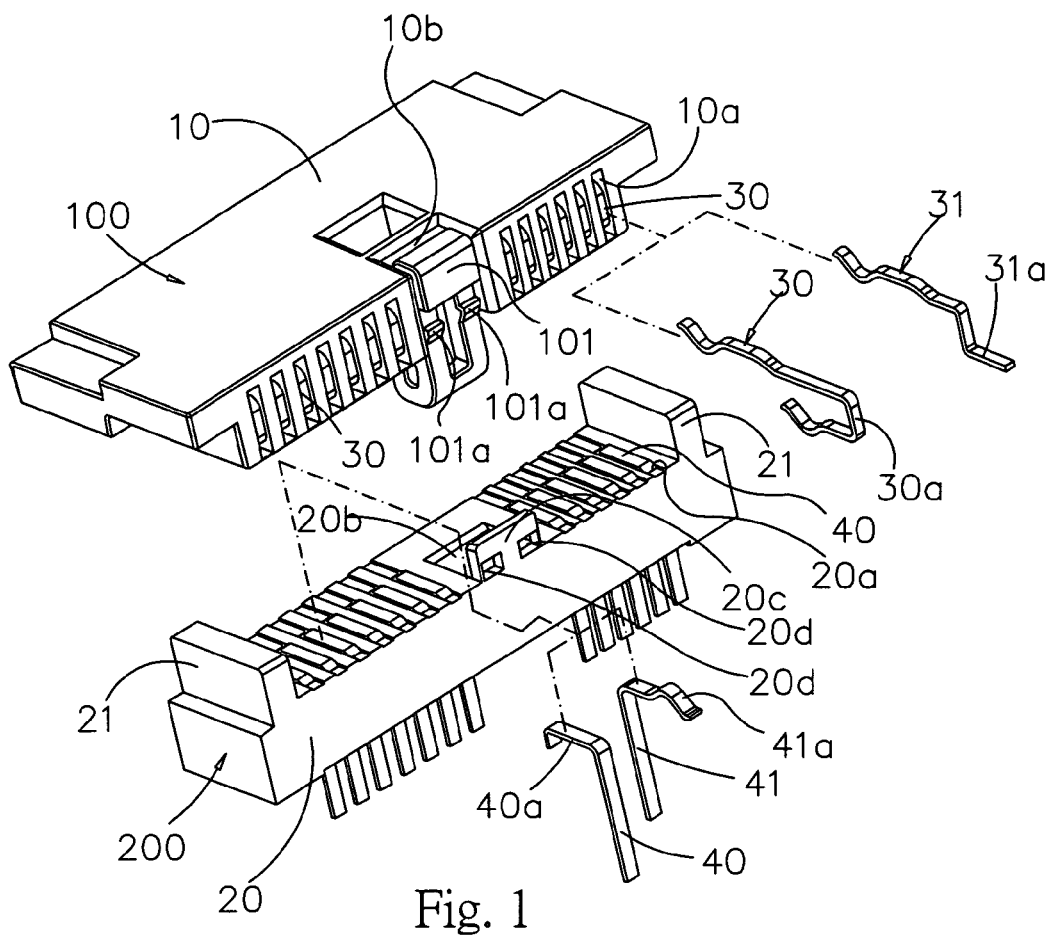
FIG. 1 shows an exploded view of a structure of an electronic connector according to an embodiment of the present invention.

FIG. 1 shows an exploded view of a structure of an electronic connector according to an embodiment of the present invention. The electronic connector 100 comprises a connector case 10 comprising a plurality of terminal holes 10a for receiving of terminals 30 and 31 and a seat connector 200.

Figure 3:
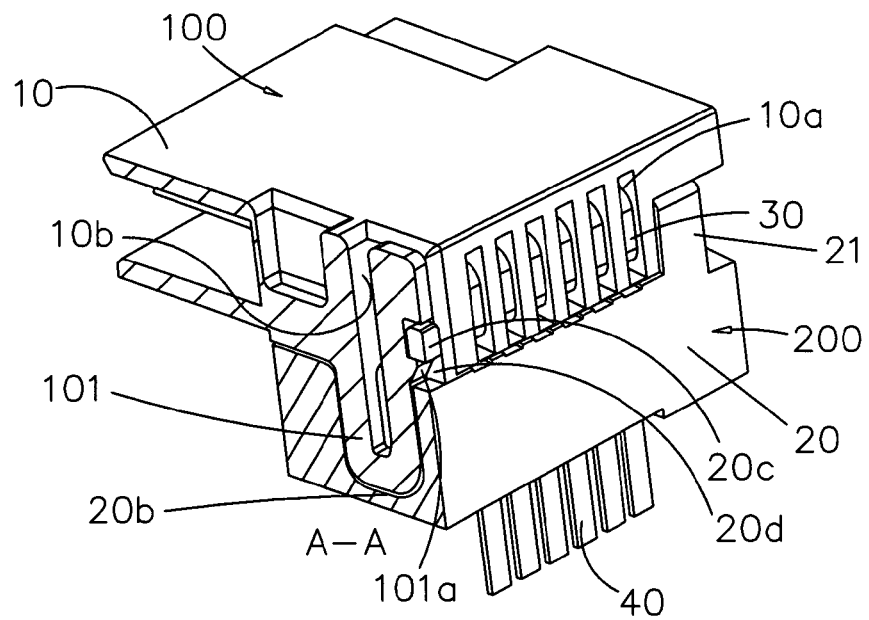
FIG. 3 shows a cross-sectional view taken along the A-A line of the structure of the electronic connector shown in FIG. 2.
Figure 8:
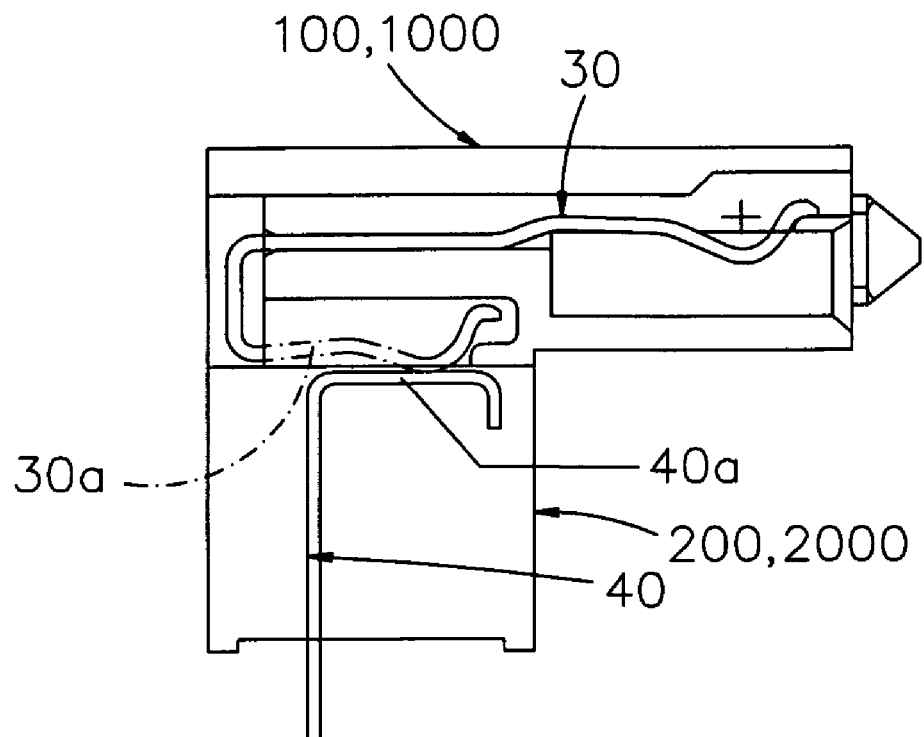
FIG. 8 shows a diagram illustrating an execution top leaning of the terminal according to an embodiment the present invention.
Figure 9:
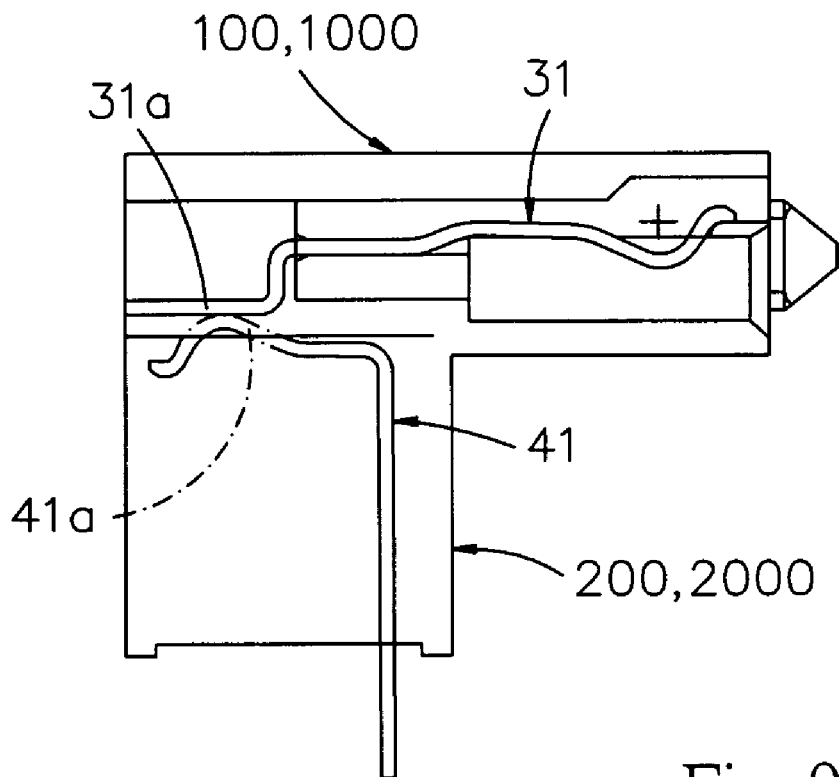
FIG. 9 shows a diagram illustrating an execution top leaning of the terminal according to the present invention.

The connector case 10 (see FIG. 3) comprises a recession 10b formed at a central region thereof, and a buckler 101 extending from underneath thereof The buckler 101 comprises a U-shape and comprises a hump hook 101a having the terminals 30 and 31 are mainly fold provided with a $\sqrt{\,}$-shaped touch end 30a on the terminal 30 or fold provided with a flat touch end 31a on the terminal 31, wherein the terminal 30 and the terminal 31 are selectable for use (see FIGS. 8, 9).

The seat connector 200 comprises a seat connector case 20 comprising a plurality of terminal holes 20a for receiving the terminals 40 and 41, and a buckling trough 20a corresponding to the bucker 101 of the connector case 10. A buckling plate 20c extends from the buckling trough 20a, and the buckling plate 20c comprises a buckling hole 20d. A protrusion plate 21 extends from both sides of the seat connector case 20.

The terminals 40 and 41 are generally folded and have a $\sqrt{\,}$-shaped touch end 41a on the terminal 41 or a flat touch end 40a on the terminal 40, wherein the terminal 40 and the terminal 41 can be selected for use (see FIGS. 8, 9).

By inserting the connector 100 into the seat connector 200 (alternatively see FIGS. 2, 3), the buckle 101 on the connector case 10 of the connector 100 can be inserted into the buckling trough 20b on the seat connector case 20 of the corresponding seat connector 200. With the hump hook 101a hooked into the buckling hole 20d of the buckling plate 20c and fixed thereby, and meanwhile the protrusion plates 21 extending from the both sides of the seat connector case 20 of the seat connector 200 mutually lean against the both sides of the connector case 10 of the connector 100. Thus a stable buckling fixation feature of the connector 100 may be achieved.

FIG. 8 shows a diagram illustrating an execution top leaning of the terminal according to an embodiment of the present invention, FIG. 9 shows a diagram illustrating an execution of top leaning of the terminal according to another embodiment of the present invention. As mentioned above, the terminals 30, 40, 31 and 41 are mainly designed such that the terminals 30 and 41 are respectively folded and have a $\sqrt{\,}$-shaped touch end 30a and 41a. Whereas the terminals 31 and 40 are respectively folded and have a flat touch end 31a and 40a, which makes it is possible to be selectively used, depending on the requirement. As shown in FIG. 8, the connectors 100, 1000 use the terminal 30 fold with a $\sqrt{\,}$-shaped touch end 30a, while seat connectors 200, 2000 use the terminal 40 fold with a flat touch end 40a. Furthermore, as shown in FIG. 9, the connectors 100, 1000 use the terminal 31 fold with a flat touch end 31a, while seat connectors 200, 2000 use the terminal 41 fold with a √-shaped touch end 41a.

Figure 4:
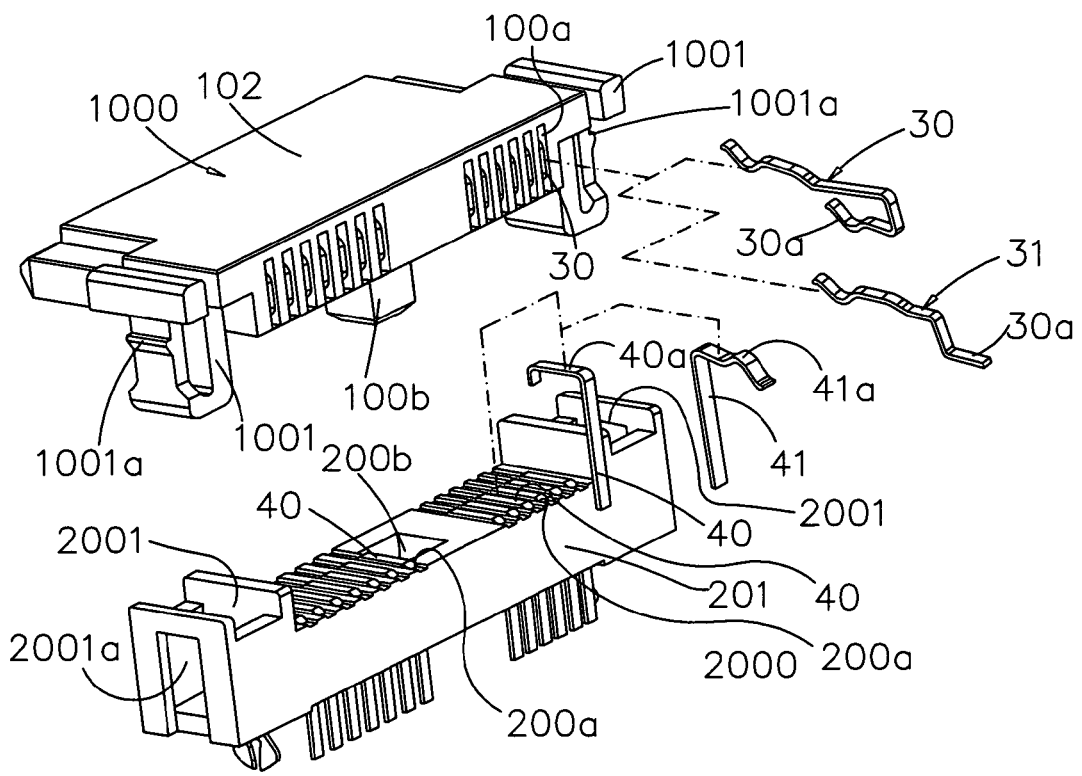
FIG. 4 shows an exploded view of a structure of an electronic connector according to another embodiment of the present invention.

FIG. 4 shows an exploded view of a structure of an electronic connector according to another embodiment of the present invention. The electronic connector comprises a connector 1000 and a connector case 2000.

Figure 5:
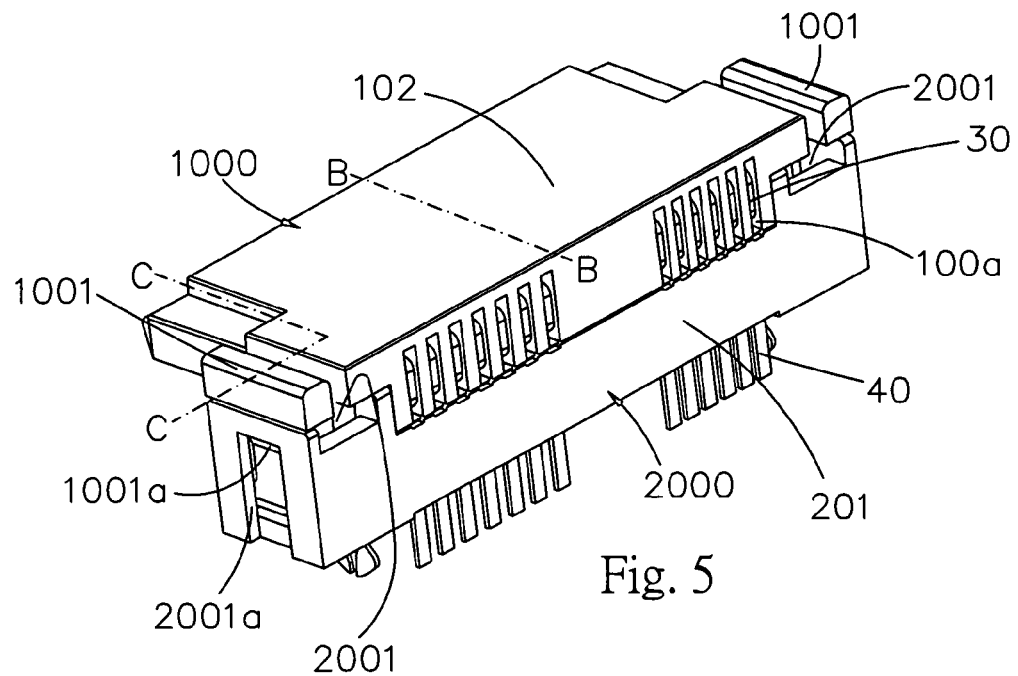
FIG. 5 shows a prospective view of a structure of an electronic connector according to another embodiment of the present invention.
Figure 6:
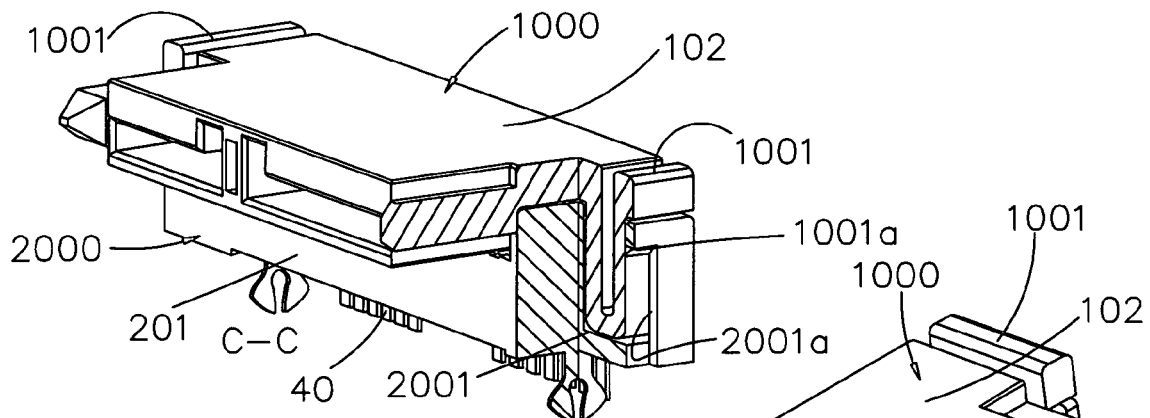
FIG. 6 shows a prospective cross-sectional view taken along the C-C line of the structure of the electronic connector shown in FIG. 5.

The connector 1000 comprises a connector case 102 comprising a plurality of terminal holes 100a for receiving terminals 30 and 31, and a plug pole 100b is disposed at a central bottom of the connector case 102. A buckle 1001 extends from both sides of the connector case 102 (alternatively shown FIGS. 5, 6). The buckle 1001 has a U-shape and has a hump hook 1001a; in which the terminals 30 and 31 are mainly folded with a √-shaped touch end 30a on the terminal 30, and a flat touch end 31a on the other side, wherein the terminal 30 and the terminal 31 can be selectively used (see FIGS. 8, 9).

Figure 7:
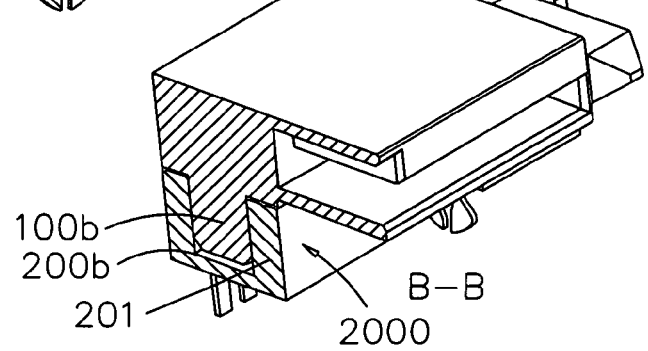
FIG. 7 shows a prospective cross-sectional view taken along the B-B line of the structure of the electronic connector shown in FIG. 5.

The seat connector 2000 comprises a seat connector case 201 comprising a plurality of terminal holes 200a for receiving the terminals 40 and 41. A buckling trough 200b corresponding to the plug pole 100b of the connector case 102 is disposed at a center of the seat connector case 201 (see FIG. 7). A buckling trough 2001 extends from both sides of the seat connector case 201, and a side plate on the buckling trough 2001 comprises a buckling hole 2001a.

The terminals 41 and 40 are generally folded and have a √-shaped touch end 41a on the terminal 41, and has a flat touch end 40a on the other side thereof. The terminals 40 and 41 may be selectively used (see FIGS. 8, 9).

By inserting the connector 1000 into the seat connector 2000 (alternatively shown FIGS. 5, 6 and 7), the buckle 1001 on the connector case 102 of the connector 1000 can be inserted into the buckling trough 2001 on both sides of the seat connector case 201 of the corresponding seat connector 2000. With the hump hook 1001a hooked into the buckling hole 2001a and fixed thereby; and meanwhile the plug pole 100b of the connector 1000 is inserted to the plug trough 200b of the seat connector 2000. Thus, a stable buckling fixation feature of the connector 1000 may be achieved.

Furthermore, the use of each of the terminals 30, 40, 31 and 41 can be fully appreciated by means of referring to the description with reference to the above-mentioned FIG. 8, 9.

As can be seen from the above description, the structure of the connector can achieve the desired features.

It is necessary to state that the above-mentioned description is simply used for illustrating the embodiments of the present invention; any modifications or changes derived from the concept thereof, in case that their function or performance thus generated pertain to the spirit encompassed by the specification and appended drawings, all should be considered as within the scope of the present invention.

DESCRIPTION OF COMPONENT SYMBOLS IN DRAWINGS 10, 102 Connector Case
10a, 20a, 100a, 200a Terminal hole
10b Recession
100, 1000 Connector
100b Plug Pole
101, 1001 Buckler
101a, 1001a Hump Hook
20, 201 Seat Connector Case
20a Plug Hole
20b, 2001 Buckling Trough
20c Buckling Plate
20d, 2001a Buckling Hole
21 Protrusion Plate
200, 2000 Seat Connector
200b Plug Trough
30 31, 40, 41 Terminal
30a, 41a √-shaped Touch End
31a, 40a Flat Touch End

DESCRIPTION OF MAJOR COMPONENT SYMBOLS

Figure 2:
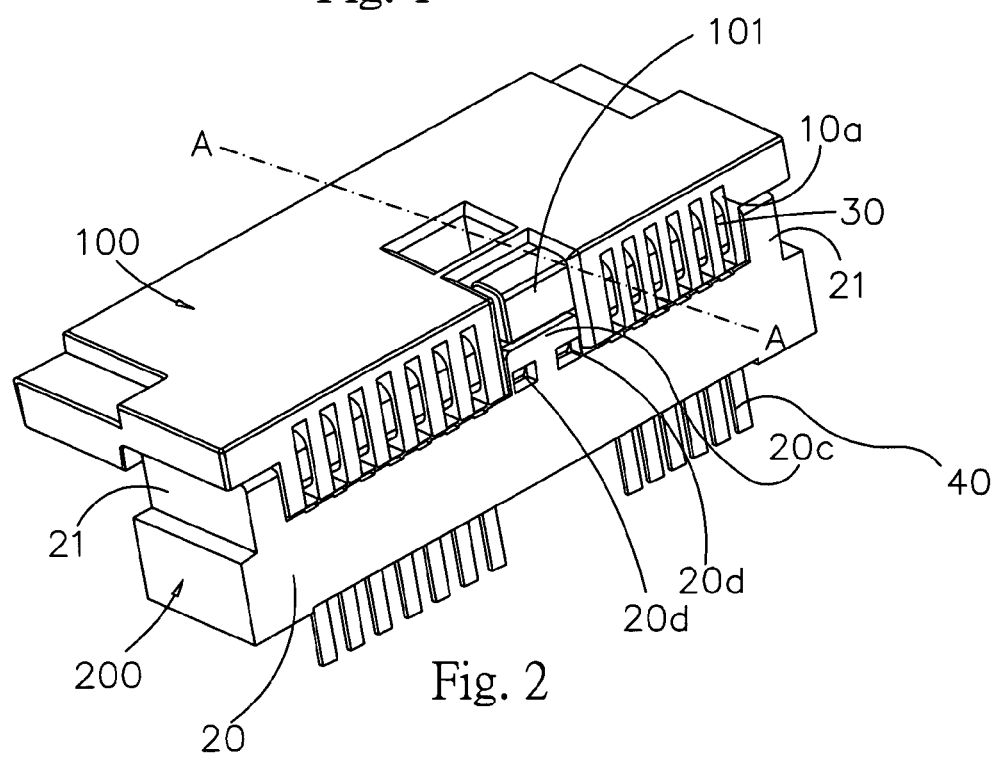
FIG. 2 shows a prospective view of a structure of an electronic connector according to an embodiment of the present invention.

Assigned Major Diagram: FIG. 2
10a Terminal Holes
100 Connector
101 Buckler
20 Seat Connector Case
20c Buckling Plate
20d Buckling Hole
21 Protrusion Plate
200 Seat Connector
30, 40 Terminal

The invention claimed is:

1. A structure of an electronic connector, comprising:
a connector, comprising a connector case comprising a plurality of first terminal holes for receiving first terminals, and a recession formed at a central region of the connector case, wherein a buckle extends from underneath of the recess, and the buckle comprises a U-shape and comprises a hump hook; and
a seat connector, a seat connector case comprising a plurality of second terminal holes for receiving second terminals, and a buckling trough corresponding to the buckle of the connector case, wherein the buckling trough comprises a buckling plate having a buckling hole, and wherein a protrusion plate extends from both sides of the seat connector case.

2. The structure of an electronic connector as claimed in claim 1, wherein the first terminals of the connector comprise a folded √ square-shaped touch end or a flat touch end, and are selectively used.

3. The structure of an electronic connector as claimed in claim 1, wherein the second terminals of the seat connector case comprise a folded √ square-shaped touch end or a flat touch end, and are selectively used.

4. A structure of an electronic connector, comprising:
a connector, comprising a connector case comprising a plurality of first terminal holes for receiving first terminals, wherein a plug pole is formed at a central region of a bottom of the connector case, and a buckle is formed on both sides of the connector case, and wherein the buckle comprises a U-shape and comprises a hump hook; and
a seat connector, comprising a plurality of second terminal holes for receiving second terminals, and wherein a first buckling trough corresponding to the plug pole of the connector case is formed at a central region of the seat connector, and wherein a second buckling trough is formed on both sides of the seat connector, and a buckling hole is formed on a plate of the buckling trough.

5. The structure of an electronic connector as claimed in claim 4, wherein the first terminals comprise a folded √ square-shaped touch end or a flat touch end, and the first terminals are selectively used.

6. The structure of an electronic connector as claimed in claim 4, wherein the second terminals comprise a folded √-shaped touch end or a flat touch end, and the second terminals are selectively used.

* * * * *